United States Patent
Goodman et al.

(10) Patent No.: US 9,106,258 B2
(45) Date of Patent: Aug. 11, 2015

(54) EARLY DATA TAG TO ALLOW DATA CRC BYPASS VIA A SPECULATIVE MEMORY DATA RETURN PROTOCOL

(71) Applicant: International Business Machines Corporation, Armonk, NY (US)

(72) Inventors: Benjiman L. Goodman, Cedar Park, TX (US); Harrison M. McCreary, Austin, TX (US); Stephen J. Powell, Austin, TX (US); William J. Starke, Austin, TX (US); Jeffrey A. Stuecheli, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 14/087,801

(22) Filed: Nov. 22, 2013

(65) Prior Publication Data

US 2015/0149854 A1   May 28, 2015

(51) Int. Cl.
*G11C 29/00* (2006.01)
*H03M 13/09* (2006.01)

(52) U.S. Cl.
CPC ..................... *H03M 13/09* (2013.01)

(58) Field of Classification Search
CPC ..................................... H03M 13/09
USPC ................... 714/763, 768, 758, 755, 752, 52; 370/242, 349, 347
See application file for complete search history.

(56) References Cited

U.S. PATENT DOCUMENTS

| | | | |
|---|---|---|---|
| 5,559,804 A * | 9/1996 | Amada et al. | 370/347 |
| 5,604,753 A | 2/1997 | Bauer et al. | |
| 5,964,896 A | 10/1999 | Thomann et al. | |
| 6,654,925 B1 | 11/2003 | Meaney et al. | |
| 7,219,294 B2 | 5/2007 | Vogt | |
| 7,543,221 B2 | 6/2009 | Mukherjee et al. | |
| 7,627,804 B2 | 12/2009 | Bains | |
| 7,984,357 B2 | 7/2011 | Kirscht et al. | |
| 8,250,450 B2 * | 8/2012 | Moats et al. | 714/799 |
| 8,612,825 B2 * | 12/2013 | Sripathi et al. | 714/758 |
| 2005/0108465 A1 | 5/2005 | Vogt | |

* cited by examiner

*Primary Examiner* — Christine Tu
(74) *Attorney, Agent, or Firm* — Steven L. Bennett; Jack V. Musgrove

(57) ABSTRACT

A bypass mechanism allows a memory controller to transmit requested data to an interconnect before the data's error code has been decoded, e.g., a cyclical redundancy check (CRC). The tag, tag CRC, data, and data CRC are pipelined from DRAM in four frames, each having multiple clock cycles. The tag includes a bypass bit indicating whether data transmission to the interconnect should begin before CRC decoding. After receiving the tag CRC, the controller decodes it and reserves a request machine which sends a transmit request signal to inform the interconnect that data is available. Once the transmit request is granted by the interconnect, the controller can immediately start sending the data, before decoding the data CRC. So long as no error is found, the controller completes transmission of the data to the interconnect, including providing an indication that the data as transmitted is error-free.

11 Claims, 4 Drawing Sheets

EARLY DATA TAG TO ALLOW DATA CRC BYPASS VIA A SPECULATIVE MEMORY DATA RETURN PROTOCOL

BACKGROUND OF THE INVENTION

1. Field of the Invention

The present invention generally relates to computer systems, and more particularly to a method of transmitting data from a memory device of a computer system to a requesting device such as a processor.

2. Description of the Related Art

The basic structure of a conventional computer system includes one or more processing units connected to a memory hierarchy via a fabric interconnect, and various peripheral devices such as a display monitor, keyboard, network interface, and permanent storage device. The processing units communicate with memory and the peripheral devices by various means, including a generalized interconnect or bus. In a symmetric multi-processor (SMP) computer, all of the processing units are generally identical, that is, they all use a common set or subset of instructions and protocols to operate, and generally have the same architecture. An exemplary processing unit is the POWER™ processor marketed by International Business Machines Corp. The processing units can also have one or more caches, such as an instruction cache and a data cache, which are implemented using high speed memory devices. Caches are commonly used to temporarily store values that might be repeatedly accessed by a processor, in order to speed up processing by avoiding the longer step of loading the values from system memory (i.e., random-access memory, or RAM). These caches are referred to as "on-board" when they are integrally packaged with the processor core on a single integrated chip. Each cache is associated with a cache controller (not shown) that manages the transfer of data between the processor core and the cache memory. The memory hierarchy can include additional caches such as a level 2 (L2) cache which supports the on-board (level 1) caches. The L2 cache acts as an intermediary between system memory and the on-board caches, and can store a much larger amount of information (instructions and data) than the on-board caches can, but at a longer access penalty. Multi-level cache hierarchies can be provided where there are many levels of interconnected caches.

When providing memory values (instructions or operand data), the memory controller or cache controller can use an error correction code (ECC) circuit to detect and correct certain errors in the values received from the memory array for transmission to the requesting unit (i.e., processor). A bit in a value may be incorrect either due to a soft error (such as stray radiation or electrostatic discharge) or to a hard error (a defective cell). ECCs can be used to reconstruct the proper data stream. Many error control codes provide information about the specific location of the erroneous bit(s). Some ECCs can only be used to detect and correct single-bit errors, i.e., if two or more bits in a particular block are invalid, then the ECC might not be able to determine what the proper data stream should actually be, but at least the failure can be detected. Other ECCs are more sophisticated and allow detection or correction of double errors, and some ECCs further allow the memory word to be broken up into clusters of bits, or "symbols," which can then be analyzed for errors in even more detail. These latter errors are costly to correct, but the design tradeoff is to halt the machine when double-bit (or higher-order) errors occur. Error-correcting memory controllers traditionally use Hamming codes, although some use triple modular redundancy. One particular error detection method is known as a cyclical redundancy check (CRC). In CRC detection, a check value is added to the data to be transmitted based on the remainder of a polynomial division of the data. When the data and check value are received, this calculation is repeated and corrective action can be taken against presumed data corruption if the check values do not match.

SUMMARY OF THE INVENTION

The present invention is generally directed to a method of providing a requested memory value in a computer system by receiving a tag from a memory device of the computer system at a memory controller of the computer system wherein the tag represents at least a portion of an address for the requested memory value in the memory device, receiving a tag error code associated with the tag from the memory device at the memory controller, decoding the tag error code at the memory controller to make a first determination that the tag is error-free, responsive to the first determination issuing a transmission request to an interconnect between the memory controller and a requesting device, receiving a transmission grant from the interconnect at the memory controller, receiving data representing the requested memory value from the memory device at the memory controller, receiving data error code associated with the data from the memory device at the memory controller, initiating transmission of the data from the memory controller to the interconnect once the transmission grant is received, after said initiating decoding the data error code at the memory controller to make a second determination that the data is error-free, and responsive to the second determination completing transmission of the data from the memory controller to the interconnect including providing an indication that the data as transmitted is error-free. In the exemplary embodiment the memory device is a system memory device, the memory controller is a system memory controller, the requesting device is a processor of the computer system, and the tag error code and the data error code are cyclical redundancy codes. The tag, tag error code, data, and data error code can be received at the memory controller in four successive frames, each frame having multiple clock cycles. The method may further include reserving a request machine of the memory controller which sends a transmit request signal to inform the interconnect that data is available for transmission. The tag can include a bypass indicator to indicate whether data transmission from the memory controller to the interconnect should begin before decoding the data error code.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The recent trend toward higher core counts per microprocessor chip has resulted in pressure to increase the chip-to-chip interconnect and dynamic random access memory (DRAM) bit rates. These higher bit rates are critical for providing the memory data bandwidth needed to keep the processor cores fed with data. However, these higher bit rates result in higher inherent bit error rates on the interconnects, thus requiring more robust ECC and/or CRC circuitry to ensure a reasonable level of data integrity. These more complex error detection/correction codes in turn have a negative impact on memory latency due to the need for deeper ECC and/or CRC logic pipelines for data checking and correction. Even though DRAM speeds have slowly improved over recent years, it has not kept up with increases in processor core speeds. Thus memory latency, relative to processor clock rates has actually degraded. Also, more cores require more cache/memory queuing structures to keep up with the large number of outstanding load operations that cannot be sourced from the cache hierarchy (i.e., a cache 'miss').

Figure 1:
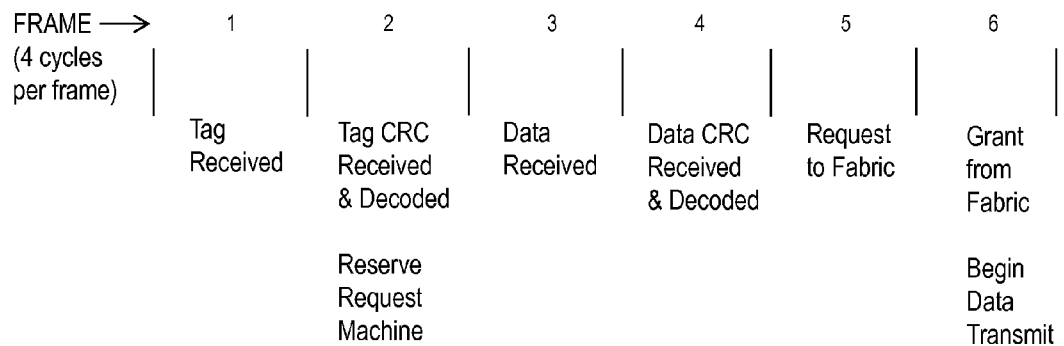
FIG. 1 is a timing diagram for a conventional memory read operation wherein a tag, a tag correction value (CRC), data, and a data correction value (CRC) are transmitted over multiple frames.

In a conventional computer system using the POWER7™ processing unit marketed by International Business Machines Corporation, data and control information are packaged into frames on the interconnect between the memory buffer chip and the processor chip (pipelined). Each frame is able to transmit 32 bytes of data every four cycles for a bandwidth of 8 bytes per cycle. CRC code bits are sent in the next frame from the one that the CRC code is protecting, meaning that a frame cannot be known to be good until the subsequent frame's CRC code has been decoded. A typical read operation is illustrated in FIG. 1. The request includes an address tag for the requested data. The address tag is usually a subset of the full address of the corresponding memory block. The tag is sent in the first frame, followed by the tag CRC value in the second frame. The requested data is then sent in the third frame, followed by the data CRC value in the fourth frame. Since control information such as the tag identifier associated with data is seen on the interconnect interface two frames before data is observed, the memory controller can reserve a data request machine before data is seen on the interface, i.e., during the second frame. However, the memory controller waits until the CRC code for the data frame has been decoded and the data is found to be without errors before requesting data transmission, so the time between information first being observed in the memory controller to a grant of data transmission to the fabric interconnect is at least six frames, not including any latency between a request and grant from the fabric.

The traditional means of improving effective memory latency has been via the use of on-chip caches to bring frequently used data closer to the consuming cores. However, limits in overall microprocessor SOC chip sizes forces a tradeoff between the number of cores on a chip and the amount of cache on the chip. Thus from a pure cache capacity standpoint the opportunity to improve effective memory load latency further is limited. It would, therefore, be desirable to devise an improved method of reducing memory latency. It would be further advantageous if the method could allow the reduction of queuing structures in the cache/memory hierarchy to avoid processor bottlenecks.

The present invention achieves these goals using a CRC bypass mechanism which allows the memory controller to provide data to the data requester before data CRC decoding, decreasing the amount of time that data is contained within the memory controller. Decreasing the memory latency on the critical data allows the out-of-order execution unit in the core to finish the memory access instruction earlier, while delaying the in-order completion of the instruction until the final data beat is sent to the core. By alerting the requester of data of any errors occurring on the final piece of data sent, the memory controller is able to maintain data integrity while also providing data earlier.

Figure 2:
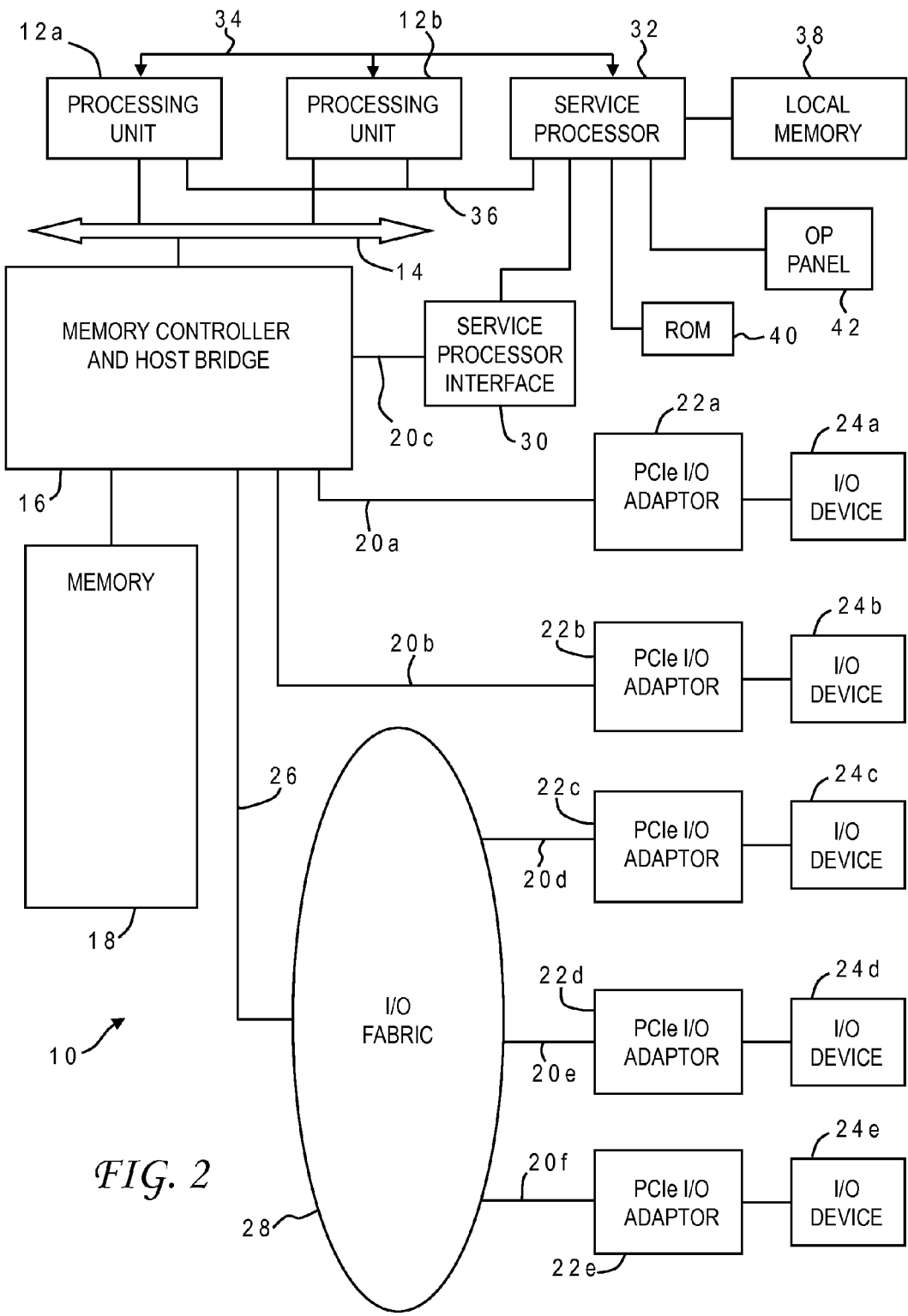
FIG. 2 is a block diagram of a computer system constructed in accordance with one implementation of the present invention.

With reference now to the figures, and in particular with reference to FIG. 2, there is depicted one embodiment 10 of a computer system in which constructed in accordance with the present invention. Computer system 10 is a symmetric multiprocessor (SMP) system having a plurality of processors 12a, 12b connected to a system bus 14. While only two processors are shown, there may be many more, and each processor may have multiple cores. System bus 14 is further connected to and communicates with a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention. The invention may further be implemented in an equivalent cloud computing network.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications, results of which may be stored in a hard disk drive of the system (an I/O device 24). While host processors 12a, 12b are executing program code, service processor 32 may enter a mode of monitoring and reporting any operating parameters or errors, such as the cooling fan speed and operation, thermal sensors, power supply regulators, and recoverable and non-recoverable errors reported by any of processors 12a, 12b, memory 18, and MC/HB 16. Service processor 32 may take further action based on the type of errors or defined thresholds.

Figure 3:
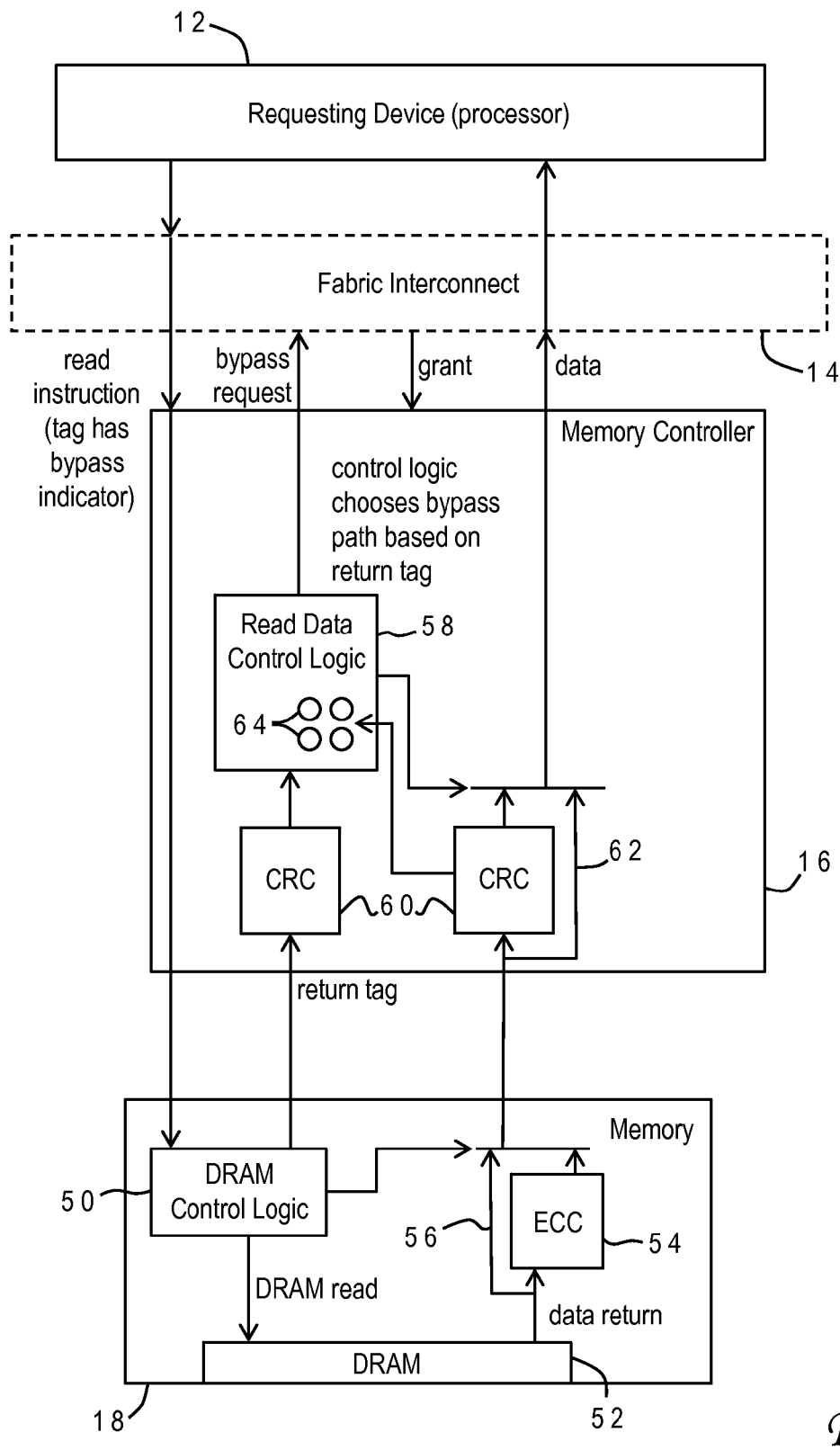
FIG. 3 is a block diagram illustrating the interaction between a memory controller and system memory for a memory read operation which allows a CRC bypass in accordance with one implementation of the present invention.

With further reference to FIG. 3, details are shown for an interface between memory controller 16 and system memory 18 for a bypass read operation. FIG. 3 illustrates those novel features which are salient to the present invention, but the memory hierarchy (and computer system) may include other features not shown including conventional features as understood by those skilled in the art. In this embodiment, system memory 18 acts as a memory buffer with an L4 cache chip ("Centaur" design), and includes DRAM control logic 50. DRAM control logic 50 receives a read instruction from a requesting device 12 (such as a processor core) via fabric interconnect 14. The read instruction includes a tag corresponding to an address of a memory block (or cache line) in system memory 18. In the illustrative implementation, the tag further includes a sideband bit which is used to provide an indication that the read operation should be attempted using a CRC bypass mechanism in order to reduce memory latency. The sideband bit is set by requesting device 12, which may seek CRC bypass for any read operation having the ability to later recover from an previously undetected error.

DRAM control logic 50 initiates a DRAM read command to DRAM array 52 for the memory block indicated by the tag. The requested data is returned from DRAM array 52 to an ECC circuit 54 and the first leg 56 of a bypass path. ECC circuit 54 is separate from the CRC check function, and is used to correct any soft or hard errors in the data as stored in DRAM array 52. When the sideband bit is set to indicate CRC bypass, DRAM control logic 50 can select leg 56 of the bypass path for direct transmission of the requested data to memory controller 16, rather than using ECC circuit 54. Memory 18 can also compute the data CRC value, after the ECC generation.

DRAM control logic 50 can immediately send the return tag, including the sideband bit indicating CRC bypass, to read data control logic 58 in memory controller 18 via a CRC circuit 60. The return data from system memory 18 is also input to a CRC circuit 60 (only one CRC circuit may be used for both tag and data), and to a second leg 62 of the bypass path. Read data control logic 58 can receive the tag and generate a current CRC value during a first time frame. When read data control logic 58 receives the tag CRC value in the second frame, it compares the two CRC values to determine whether the tag contains any error. If no error is detected, read data control logic 58 can then select leg 62 of the bypass path for direct transmission of the requested data to requesting device 12 (via fabric interconnect 14), rather than using CRC circuit 60 (the CRC bypass mechanism may include only leg 62 but inclusion of leg 56 further enhances the memory latency reduction). If an error is detected, the read operation must be retried or other corrective action taken. If there is no error in the tag, read data control logic 58 can reserve a request machine 64. Request machines 64 (within read data control logic 58 in this embodiment) are finite state machines used to schedule completion of the read operation, and they send a transmit request signal to let fabric interconnect 14 know that data is available for transmission. Read data control logic 58 may have any number of request machines depending upon the architecture of the fabric interconnect; in the exemplary embodiment there are 8 request machines.

As part of the CRC bypass mechanism, read data control logic 58 can instruct a request machine 64 to send a request for transmission to fabric interconnect 14 upon a favorable decoding of the tag CRC value, immediately after reserving a machine, i.e., still during the second frame, and before memory controller 16 has even received the data from system memory 18, which occurs during the third frame in this embodiment. The ultimate validity of the transmission is contingent upon the data being decoded as good, which occurs during the fourth frame after receiving the data CRC value. Accordingly, a request machine 64 can be allocated and can send the transmit request signal to fabric interconnect 14 before data CRC decoding.

Figure 4:
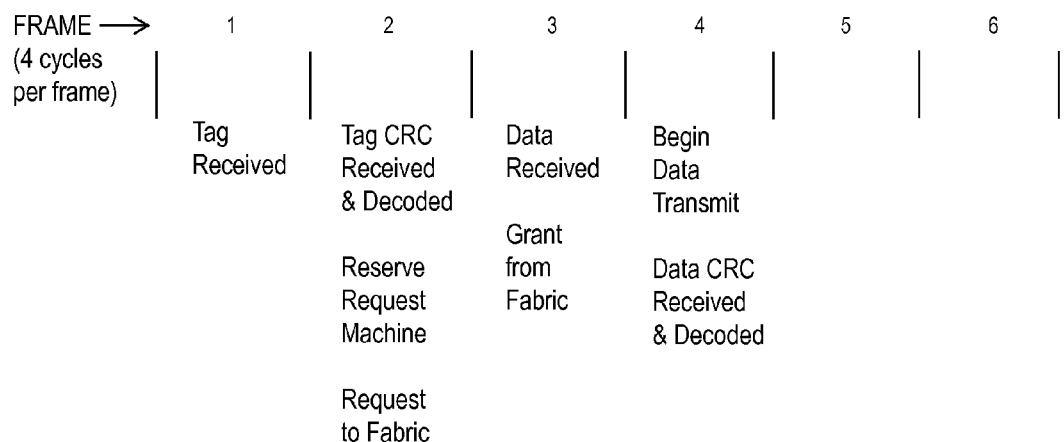
FIG. 4 is a timing diagram for a memory read operation in accordance with one implementation of the present invention wherein a request is issued to transmit data before data CRC checking.

An optimum implementation of this procedure is reflected in the timing diagram of FIG. 4. As with the conventional routine for interfacing with a Centaur design chip, the tag, tag CRC value, data, and data CRC value are received in four successive frames (each frame having four clock cycles). However, the present invention allows for the request for transmission by the request machine to be issued during the second frame, immediately upon decoding the tag CRC value (presuming the decoding is favorable). In this manner, the request for transmission can be immediately granted by the fabric during the third frame and data transmission to the fabric can be initiated before CRC decoding, at the beginning of the fourth frame.

The CRC bypass mechanism can request data in such a way as to eliminate both the latency waiting for decoding good CRC as well as the request to grant latency from the fabric (the memory controller is able to hide the entirety of the minimum request to grant latency into the time needed to wait for the data). Because the memory controller is sending unchecked data to the requester of data, the system can alert the requester when the data is bad and must be re-requested. This feature can be implemented in a variety of methods, but in the exemplary embodiment it is carried out by requiring the last octaword of any cache line to wait for its CRC decode and by pooling any error indication from any octaword of the cache line and sent with the last octaword.

Figure 5:
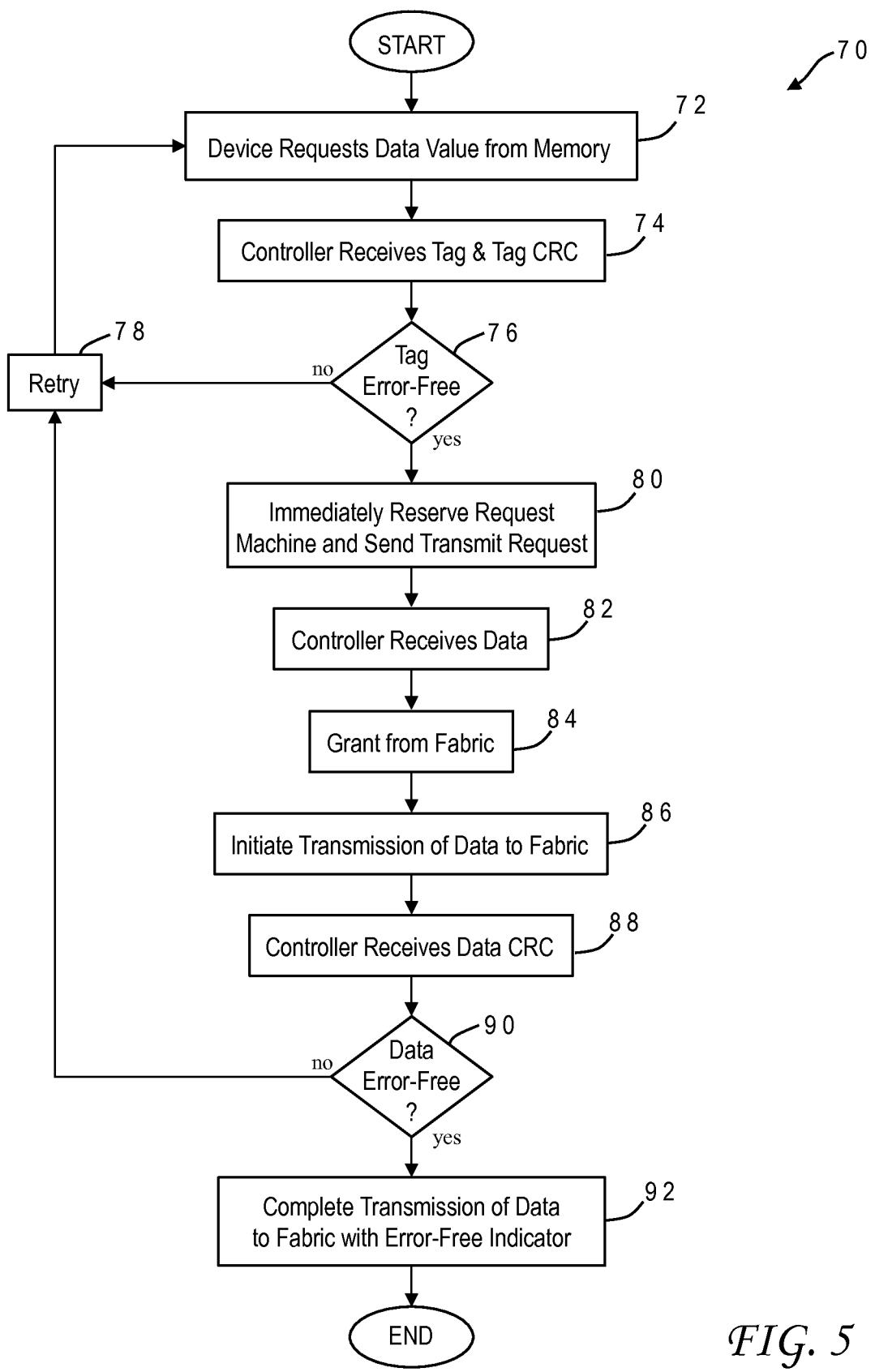
FIG. 5 is a chart illustrating the logical flow for a memory read operation in accordance with one implementation of the present invention.

The present invention may be further understood with reference to the chart of FIG. 5 which illustrates the logical flow for a memory read operation 70 in accordance with one implementation of the present invention. The read operation begins with a device such as a processor requesting a data value from system memory (72). The memory controller receives the tag and tag CRC for the requested value (74), and checks to see if any errors are present (76). If an error is found, the controller informs the requester that the operation must be retried (78). If there is no error in the tag, a request machine is immediately reserved and a request is generated for the request machine (80). The controller then receives the data from system memory (82), and a transmission grant from the fabric (84). The controller can initiate transmission of the data to the fabric (86) before it receives the data CRC from system memory (88). As with the transmission from system memory to the controller, the controller can transmit the tag, tag CRC, data and data CRC in four separate frames. The controller checks to see if any errors are present in the data CRC (90). If an error is found, the controller again informs the requester that the operation must be retried (78). If there is no error in the data, the controller can complete the transmission of data to the fabric, including an indicator that the data as transmitted is error-free (92).

With the CRC bypass mechanism of the present invention, the memory controller is able to request that data be sent before the data is captured from the interconnect interface, and send the data before its CRC decode has completed, resulting in a much smaller data latency inside the memory controller. In addition to enabling faster execution, improving memory latency reduces number of outstanding memory read operations at any given time, thus reducing depth of queuing structures in the cache/memory hierarchy required to prevent the stalling of execution streams.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, the invention has been disclosed in the context of a memory controller for a system memory, but it is equally applicable to other memory structures such as cache memory or a cache controller. Also, components of the system are depicted as being part of system memory or the memory controller but these components may be placed differently. It is therefore contemplated that such modifications can be made without departing from the spirit or scope of the present invention as defined in the appended claims.

What is claimed is:

1. A memory controller comprising:
   at least one error detection circuit; and
   control logic which
   receives a tag representing at least a portion of an address for a requested memory value in a memory device,
   receives a tag error code associated with the tag,
   makes a first determination that the tag is error-free using the error detection circuit,
   responsive to the first determination, issues a transmission request to an interconnect between the memory controller and a requesting device,
   receives a transmission grant from the interconnect,
   receives data representing the requested memory value,
   receives data error code associated with the data,
   makes a second determination that the data is error-free using the error detection circuit,
   initiates transmission of the data from the memory controller to the interconnect once the transmission grant is received and before making the second determination; and
   responsive to the second determination, completes transmission of the data from the memory controller to the interconnect, including providing an indication that the data as transmitted is error-free.

2. The memory controller of claim 1 wherein said control logic is adapted to receive the tag, the tag error code, the data, and the data error code in four successive frames, each frame having multiple clock cycles.

3. The memory controller of claim 1 wherein the tag error code and the data error code are cyclical redundancy codes.

4. The memory controller of claim 1 wherein said control logic includes a plurality of request machines which send a transmit request signal to inform the interconnect that data is available for transmission, and said control logic first reserves one of said request machines when issuing the transmission request.

5. The memory controller of claim 1 wherein the tag includes a bypass indicator to indicate whether data transmission from the memory controller to the interconnect should begin before decoding the data error code.

6. A computer system comprising:
   one or more processors which process program instructions;
   an interconnect for transmitting data to said processors;
   a memory device which stores memory values; and
   a memory controller which
   receives a tag from said memory device representing at least a portion of an address for a memory value requested by one of said processors,
   receives a tag error code associated with the tag,
   decodes the tag error code to make a first determination that the tag is error-free,
   responsive to the first determination, issues a transmission request to said interconnect,
   receives a transmission grant from said interconnect,
   receives data representing the requested memory value from said memory device,
   receives data error code associated with the data from said memory device,
   initiates transmission of the data to the interconnect once the transmission grant is received,
   decodes the data error code to make a second determination that the data is error-free, and
   responsive to the second determination, completes transmission of the data to the interconnect, including providing an indication that the data as transmitted is error-free.

7. The computer system of claim 6 wherein said memory device sends the tag, the tag error code, the data, and the data error code to said memory controller in four successive frames, each frame having multiple clock cycles.

8. The computer system of claim 6 wherein the tag error code and the data error code are cyclical redundancy codes.

9. The computer system of claim 6 wherein said memory controller includes a plurality of request machines which send a transmit request signal to inform said interconnect that data is available for transmission, and includes control logic which first reserves one of said request machines when issuing the transmission request.

10. The computer system of claim 6 wherein the tag includes a bypass indicator to indicate whether data transmission from said memory controller to said interconnect should begin before decoding the data error code.

11. The computer system of claim 10 wherein said memory device includes an error correction circuit, a leg of a bypass path, and control logic for selecting said leg of said bypass path instead of said error correction circuit for sending the data to said memory controller based on a value of the bypass indicator in the tag.

* * * * *